United States Patent
Urabe et al.

(10) Patent No.: US 7,209,391 B2
(45) Date of Patent: Apr. 24, 2007

(54) NONVOLATILE SEMICONDUCTOR MEMORY DEVICE AND METHOD OF REWRITING DATA THEREOF

(75) Inventors: Katsutoshi Urabe, Tokyo (JP); Yuji Uji, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/087,734

(22) Filed: Mar. 24, 2005

(65) Prior Publication Data

US 2005/0237798 A1    Oct. 27, 2005

(30) Foreign Application Priority Data

Mar. 30, 2004    (JP) ............................. 2004-097746

(51) Int. Cl.
*G11C 16/06* (2006.01)

(52) U.S. Cl. ............ 365/185.23; 365/100; 365/185.03; 365/185.2; 365/185.21

(58) Field of Classification Search ................. 365/100, 365/187, 188
See application file for complete search history.

(56) References Cited

U.S. PATENT DOCUMENTS

| | | | | |
|---|---|---|---|---|
| 4,380,057 A | * | 4/1983 | Kotecha et al. ............. | 365/184 |
| 5,021,999 A | * | 6/1991 | Kohda et al. ........... | 365/185.03 |
| 5,237,530 A | * | 8/1993 | Takashina et al. ...... | 365/185.23 |
| 5,262,919 A | * | 11/1993 | Kuriyama et al. ...... | 365/189.05 |
| 6,317,349 B1 | * | 11/2001 | Wong ........................... | 365/49 |
| 6,563,736 B2 | * | 5/2003 | Hsu et al. ............... | 365/185.18 |
| 6,655,758 B2 | * | 12/2003 | Pasotti et al. ........... | 365/185.24 |
| 6,714,456 B1 | * | 3/2004 | Ogura et al. ........... | 365/185.28 |
| 6,922,361 B2 | * | 7/2005 | Kim ....................... | 365/185.18 |

FOREIGN PATENT DOCUMENTS

| | | |
|---|---|---|
| JP | 2001-43691 | 2/2001 |
| JP | 2002-25286 | 1/2002 |

* cited by examiner

*Primary Examiner*—Tan T. Nguyen
(74) *Attorney, Agent, or Firm*—McDermott Will & Emery LLP

(57) ABSTRACT

The nonvolatile semiconductor memory device of the present invention includes a memory cell array wherein data is stored in a nonvolatile state based on a difference in memory information between two memory cells comprising a memory cell pair, and a writing controller for writing data to the memory cell array. The writing controller is capable of individually setting memory information of each of the memory cells in the memory cell array.

6 Claims, 9 Drawing Sheets

| SAO0 | SAO1 | SAO2 | PD |
|---|---|---|---|
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

TRUE-SIDE MEMORY CELL

BAR-SIDE MEMORY CELL

TRUE-SIDE MEMORY CELL

BAR-SIDE MEMORY CELL

TRUE-SIDE MEMORY CELL

BAR-SIDE MEMORY CELL

TRUE-SIDE MEMORY CELL

BAR-SIDE MEMORY CELL

F I G . 1 6
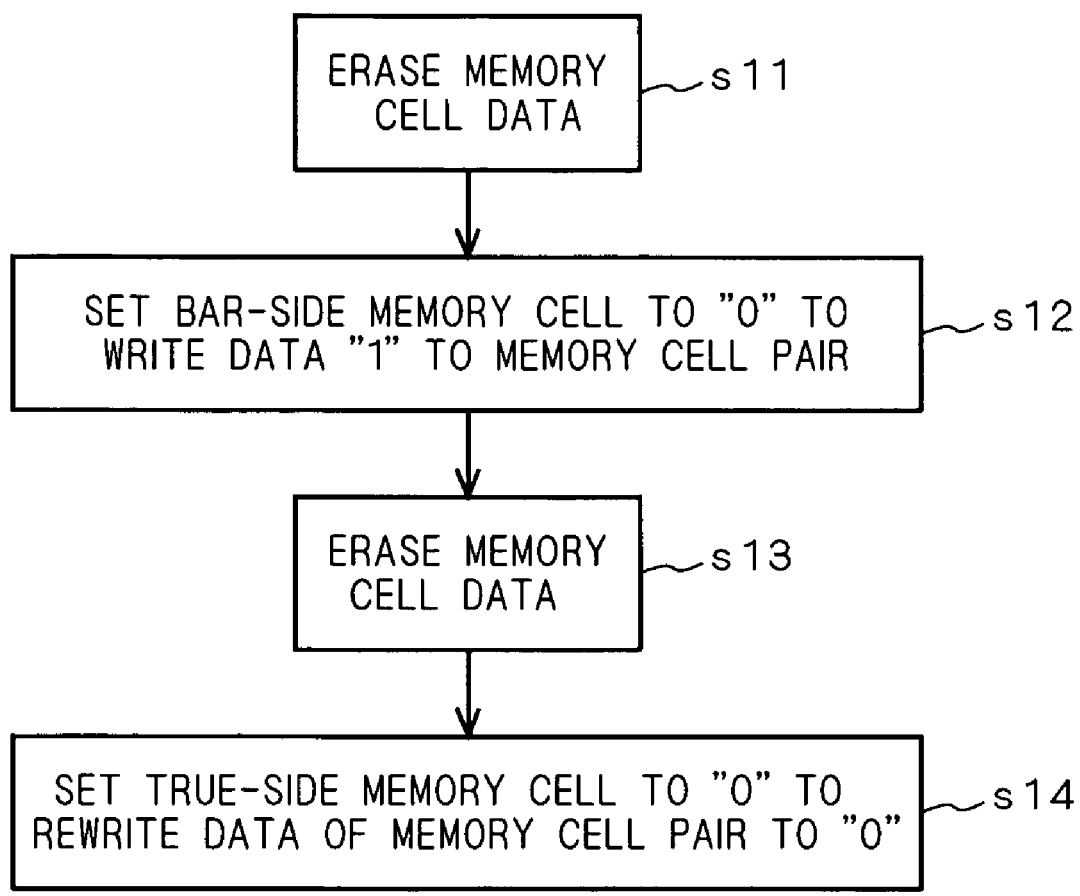

NONVOLATILE SEMICONDUCTOR MEMORY DEVICE AND METHOD OF REWRITING DATA THEREOF

BACKGROUND OF THE INVENTION

1. Field of the Invention

The present invention relates to a nonvolatile semiconductor memory device including a plurality of memory cells.

2. Description of the Background Art

Japanese Patent Application Laid-Open No. 2002-025286 discloses conventional nonvolatile semiconductor memory devices such as EPROM (Erasable Programmable ROM) and EEPROM (Electrically Erasable Programmable ROM). According to a nonvolatile semiconductor memory device disclosed in Japanese Patent Application Laid-Open No. 2002-025286, the difference between a signal from a certain memory cell and a predetermined reference signal is amplified by a differential sense amplifier, and the resultant output signal is considered as data written in the memory cell. Japanese Patent Application Laid-Open No. 2001-043691 also discloses a nonvolatile semiconductor memory device.

As described above, the differential sense amplifier employed in a conventional nonvolatile semiconductor memory device compares a signal from a memory cell with a predetermined reference signal. When a noise and the like generate under this configuration, it is difficult to secure a signal difference with enough amplitude at the input of the differential sense amplifier, thereby causing the differential sense amplifier to malfunction at times. As a result, reliability of the nonvolatile semiconductor memory device cannot be secured to a satisfactory degree in such a case.

SUMMARY OF THE INVENTION

An object of the present invention is to provide technology for improving the reliability of a nonvolatile semiconductor memory device.

The nonvolatile semiconductor memory device of the present invention includes a memory cell array having a plurality of memory cells, and a writing controller for writing data into the memory cell array. The memory cell array stores data in a nonvolatile state with respect to each memory cell pair composed of two memory cells. The data storing is executed based on a difference in memory information between the two memory cells included in one memory cell pair. The writing controller is capable of setting the memory information individually for each of the memory cells of the memory cell array.

Since the memory information of each of the memory cells of the memory cell array can be set individually, upon writing data into the memory cell array, it is possible to set a large difference in the memory information between two memory cells included in one memory cell pair. This prevents a malfunction of a circuit for detecting a difference in such memory information, and as a result, the nonvolatile semiconductor memory device of the present invention will have an improved reliability.

The present invention is also intended for a method of rewriting data of the nonvolatile semiconductor memory device of the present invention. The nonvolatile semiconductor memory device includes a memory cell array having a plurality of memory cells, and a writing controller for writing data into the memory cell array. The method of rewriting data has steps (a) and (b). The memory cell array stores data in a nonvolatile state with respect to each memory cell pair composed of two memory cells. The data storing is executed based on a difference in memory information between the two memory cells. Each of the memory cells of the memory cell array is a memory cell transistor having a control gate and a floating gate. The writing controller is capable of setting the threshold voltage of each of the memory cells of the memory cell array to three or more levels. The writing controller sets the memory information of each of the memory cells individually by setting a threshold voltage of each of the memory cells of the memory cell array. The nonvolatile semiconductor memory device further includes a plurality of differential sense amplifiers for amplifying the output difference of two memory cells included in the corresponding memory cell pair for outputting. The step (a) is to write data into said memory cell pair, and the step (b) is to rewrite the data written in the step (a). In the step (a), the threshold voltage of one memory cell included in the memory cell pair is set to a higher level than that of the threshold voltage of the other memory cell in the memory cell pair, while the threshold voltage of the other memory cell is set to a level chosen from three or more levels except the greatest one. In the step (b), the threshold voltage of one memory cell is increased to a level greater than the threshold voltage of the other memory cell.

Since the data of the memory cell pair can be rewritten without involving a data erasing operation, the rewriting of data can be performed easily.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 shows the voltage waveforms of a supply voltage and an internally boosted voltage BOOST at power-on.

FIG. 16 is a flow chart illustrating operations of a nonvolatile semiconductor memory device according to the preferred embodiment of the present invention when the threshold voltage setting for each memory cell is limited to two kinds only.

DESCRIPTION OF THE PREFERRED EMBODIMENTS

Figure 1:
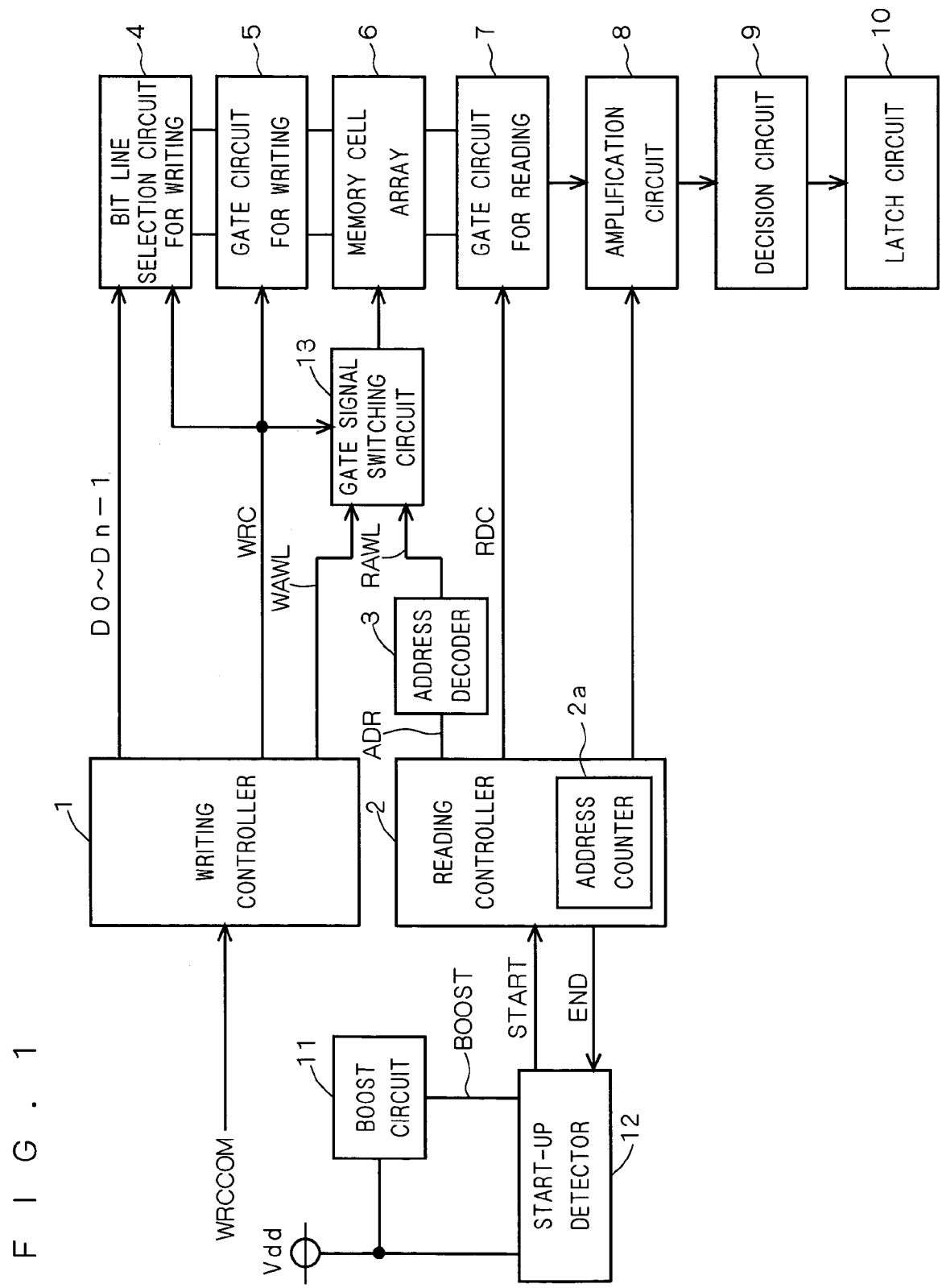
FIG. 1 is a block diagram illustrating the structure of a nonvolatile semiconductor memory device according to a preferred embodiment of the present invention.

FIG. 1 is a block diagram illustrating the structure of a nonvolatile semiconductor memory device (hereinafter simply referred to as "semiconductor memory device") according to a preferred embodiment of the present invention. The semiconductor memory device according to the present preferred embodiment is, for example, an EPROM on which data can be erased using ultraviolet light, and is incorporated into a semiconductor integrated circuit comprising elements such as a CPU and a DRAM. Further, information to be stored in the semiconductor memory device according to the present preferred embodiment includes, for example, chip information containing information for adjusting an internal voltage in the semiconductor integrated circuit and a lot number and the like, and replacement information for repairing a defect memory cell in a DRAM by using a redundant cell.

As shown in FIG. 1, the present semiconductor memory device includes a memory cell array 6 for storing data in a nonvolatile state, a writing controller 1 for writing data into the memory cell array 6, a reading controller 2 for reading data from the memory cell array 6, an address decoder 3, and a gate signal switching circuit 13.

Upon reading data from the memory cell array 6, the reading controller 2 sends to the address decoder 3 an address signal ADR generated by an address counter 2a provided inside the controller. Upon receiving the address signal ADR, the address decoder 3 decodes the address signal ADR and then sends a word line activation signal for reading RAWL to the gate signal switching circuit 13.

A write command WRCOM from a CPU and the like (not shown) prompts the writing controller 1 to write data into the memory cell array 6. Upon writing data, the writing controller 1 sends a word line activation signal for writing WAWL to the gate signal switching circuit 13.

The gate signal switching circuit 13 sends to a word line WL either one of the word line activation signal for reading RAWL or word line activation signal for writing WAWL based on the value of a write control signal WRC provided by the writing controller 1. More specifically, when the write control signal WRC is "0", the gate signal switching circuit 13 outputs the word line activation signal for reading RAWL, and when the write control signal WRC is "1", it outputs the word line activation signal for writing WAWL. As a result, a gate voltage for reading Vg1 is applied to the word line WL of the memory cell array 6 upon reading, and a gate voltage for writing Vg2 is applied to the word line WL of the memory cell array 6 upon writing.

Further, the semiconductor memory device according to the present preferred embodiment includes a bit line selection circuit for writing 4, a gate circuit for writing 5, a gate circuit for reading 7, an amplification circuit 8, a decision circuit 9; and a latch circuit 10. The operations of the bit line selection circuit for writing 4 and the gate circuit for writing 5 are controlled by the writing controller 1. The operations of the gate circuit for reading 7 and the amplification circuit 8 are controlled by the reading controller 2. Furthermore, the semiconductor memory device according to the present preferred embodiment includes a boost circuit 11 for boosting a supply voltage Vdd to be output as an internally boosted voltage BOOST, and a start-up detector 12 for detecting a start-up of the present semiconductor memory device based on the supply voltage Vdd and the internally boosted voltage BOOST.

Figure 2:
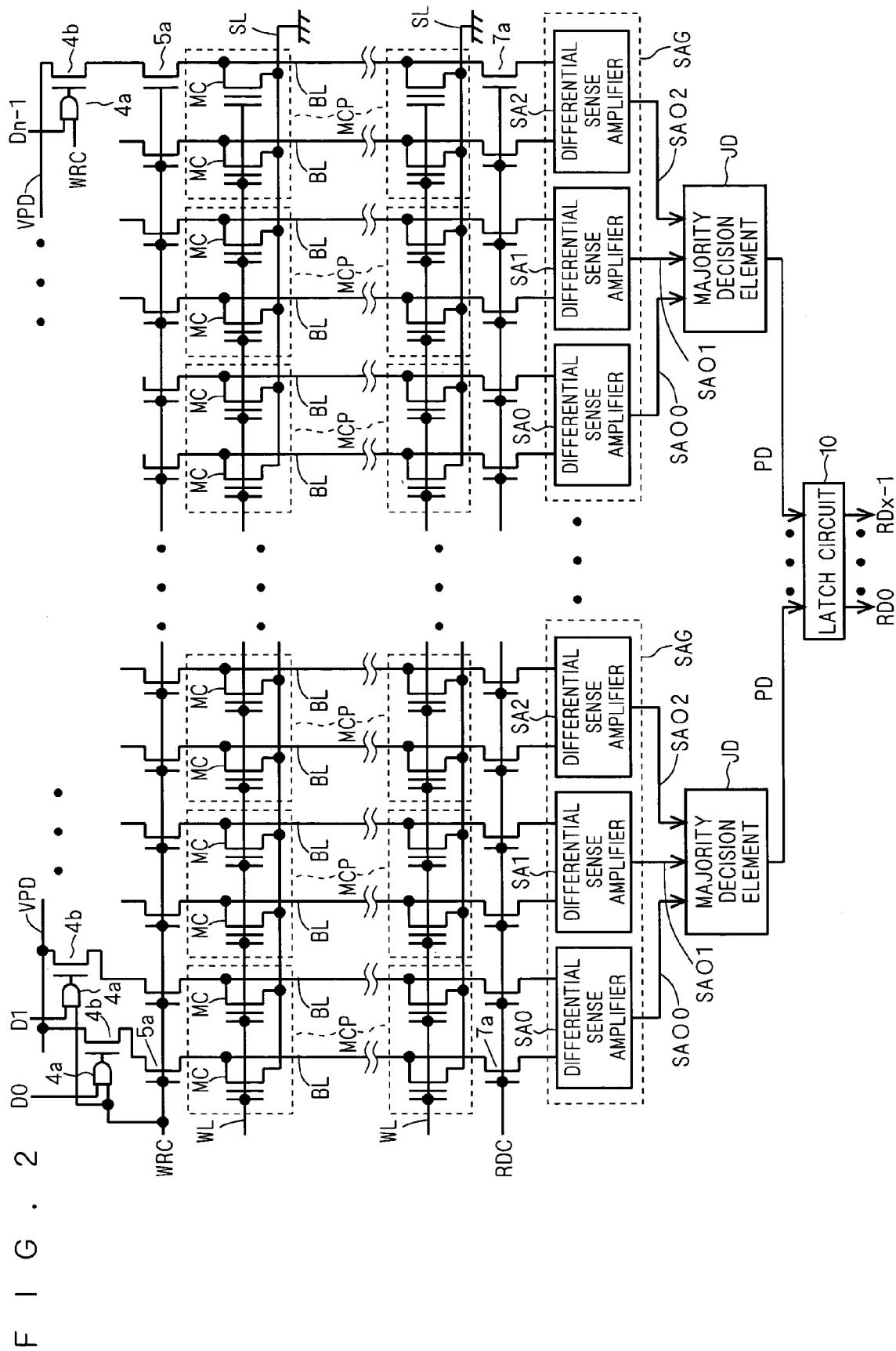
FIG. 2 is a block diagram illustrating the structure of a nonvolatile semiconductor memory device according to the preferred embodiment of the present invention.

FIG. 2 is a block diagram illustrating the structures of the bit line selection circuit for writing 4, the gate circuit for writing 5, the memory cell array 6, the gate circuit for reading 7, the amplification circuit 8, the decision circuit 9 and the latch circuit 10. As shown in FIG. 2, the memory cell array 6 comprises (m×n) pieces of memory cells MC (where $n \geq 2$ and $m \geq 2$), m number of word lines WL extending row-wise, n number of bit lines BL extending column-wise, and m number of source lines SL extending row-wise. Each of the source lines SL is provided with a ground potential.

A plurality of memory cells MC provided in a matrix are memory cell transistors each comprising a control gate and a floating gate. Each of the word lines WL is connected to control gates of n number of memory cells MC lined row-wise. Each of the bit lines BL is connected to drains of m number of memory cells MC lined column-wise. Each of the source lines SL is connected to sources of n number of memory cells MC lined row-wise.

The memory cell array 6 according to the present preferred embodiment has a structure wherein two memory cells MC adjacent row-wise comprise a memory cell pair MCP serving as a unit of data storage. Under this configuration, (n/2) pieces of memory cell pairs MCP are connected to each of the word lines WL, and (m×n/2) pieces of memory cell pairs MCP are included in the memory cell array 6. The memory cell array 6 stores data with respect to each memory cell pair MCP as a unit of data storage, based on a difference in memory information between two memory cells MC included in one memory cell pair MCP. That is, in the present preferred embodiment, a difference in memory information between the memory cells MC of a certain memory cell pair MCP causes data to be written into that particular memory cell pair MCP. This data writing is described in detail in the following.

In the present preferred embodiment, a memory transistor including a control gate and a floating gate is employed as the memory cell MC. As such, the setting of memory information of the memory cell MC is determined by setting the threshold voltage of the memory cell MC. Therefore, if two memory cells MC have a threshold voltage different from each other, the memory cells have memory information different from each other. The memory cell array 6 of the present preferred embodiment stores data based on a difference in the threshold voltage between the memory cells MC included in one memory cell pair MCP. In other words, a difference in the threshold voltage between two memory cells MC in a certain memory cell pair MCP causes data to be written into that particular memory cell pair MCP.

In the present preferred embodiment, in order to write data "1" into a certain memory cell pair MCP composed of two memory cells MC, the threshold voltage of one memory cell MC is set lower than the threshold voltage of the other memory cell MC. In contrast, in order to write data "0" into a certain memory cell pair MCP composed of two memory cells MC, the threshold voltage of one memory cell MC is set higher than the threshold voltage of the other memory cell MC. Hereinafter, the memory cell with a lower threshold voltage when data "1" is written into the memory cell pair MCP is referred to as a "true-side memory cell MC", and the remaining memory cell MC is referred to as a "bar-side memory cell MC".

For example, assume a situation where a certain memory cell MC has a threshold voltage of 1.5 V provided that hot electrons are not injected into that particular memory cell. In this case, hot electrons are injected only into the floating gate of the bar-side memory cell MC of the memory cell pair MCP, thereby to set the threshold voltage thereof at 6 V. As a result, the threshold voltage (1.5 V) of the true-side memory cell MC of the memory cell pair MCP becomes lower than the threshold voltage (6 V) of the bar-side memory cell MC, and data "1" is written into the memory cell pair MCP.

In contrast, in order to write data "0", hot electrons are injected only into the floating gate of the true-side memory cell MC of the memory cell pair MCP, thereby to set the threshold voltage thereof at 6 V. This causes the threshold voltage (6 V) of the true-side memory cell MC to be higher than the threshold voltage (1.5 V) of the bar-side memory cell MC, and data "0" is written into the memory cell pair MCP.

In this manner, in the present preferred embodiment, with regard to the memory cell array 6, data is written with respect to each memory cell pair MCP. Further, according to data value to be written, relative size of threshold voltage between two memory cells MC included in one memory cell pair MCP is manipulated. Such a writing control is carried out by the writing controller 1, description thereof is to be given later.

The gate circuit for reading 7 comprises n number of NMOS transistors 7a provided in a one-to-one relationship to n number of bit lines BL, as shown in FIG. 2. A source of each of the NMOS transistors 7a is connected to one end of its corresponding bit line BL, and gates of the NMOS transistors 7a are connected to each other. The gate of the NMOS transistor 7a is provided with a read control signal RDC from the reading controller 2. The read control signal RDC turns n number of NMOS transistors 7a simultaneously on when data is read from the memory cell array 6.

The amplification circuit 8 comprises x number of differential sense amplifier groups SAG (x≧2). Each of the differential sense amplifier groups SAG comprises three differential sense amplifiers SA0 to SA2. The decision circuit 9 comprises x number of majority decision elements JD, which are provided in a one-to-one relationship to x number of differential sense amplifier groups SAG.

Each of the differential sense amplifier groups SAG has a configuration where two inputs of the differential sense amplifier SA0 are respectively connected to drains of two NMOS transistors 7a which are respectively connected to two adjacent bit lines BL. In the same manner, two inputs of the differential sense amplifiers SA1, SA2 are respectively connected to drains of two NMOS transistors 7a which are respectively connected to two adjacent bit lines BL.

Accordingly, while the NMOS transistors 7a are in an ON state, two inputs of the respective differential sense amplifiers SA0 to SA2 are electrically connected to two bit lines BL. Each of the differential sense amplifiers SA0 to SA2 amplifies the difference in output between the true-side memory cell MC and the bar-side memory cell MC included in one memory cell pair MCP that is electrically connected to two bit lines BL. The amplified results in the differential sense amplifiers SA0 to SA2 are then respectively output as data SAO0 to SAO2.

The majority decision element JD obtains a majority logic of the data SAO0 to SAO2 output from their corresponding differential sense amplifiers SA0 to SA2 included in the differential sense amplifier group SAG. In the present preferred embodiment, the same data is written into three memory cell pairs MCP which are electrically connected to one differential sense amplifier group SAG. Based on the majority logic obtained from the data SAO0 to SAO2, the majority decision element JD according to the present preferred embodiment decides the data written into the three memory cell pairs MCP. The decision result then is output as data PD.

In the latch circuit 10, x number of data PD output from the majority decision element JD are latched, then output as x bits of read data RD0 to DRx−1. These read data RD0 to DRx−1 are read data output to the outside of the present semiconductor memory device. Receiving the read data RD0 to DRx−1, a CPU and the like provided adjacent to the present semiconductor memory device recognize information written in the present semiconductor memory device.

As stated above, in the present preferred embodiment, each of the differential sense amplifier group SAG is connected to six bit lines BL so that the relationship between the number of the bit line BL (n) and the number of the majority decision element JD (x) is expressed by the following: n=x×6.

The gate circuit for writing 5 comprises n number of NMOS transistors 5a provided in a one-to-one relationship to n number of bit lines BL, as shown in FIG. 2. A source of each of the NMOS transistors 5a is connected to the other end of its corresponding bit line BL, and gates of the NMOS transistors 5a are connected to each other. The gate of the NMOS transistor 5a is provided with the write control signal WRC from the writing controller 1. The write control signal WRC turns n number of NMOS transistors 5a simultaneously on when data is written into the memory cell array 6.

The bit line selection circuit for writing 4 comprises n number of AND circuits 4a and n number of NMOS transistors 4b. One of the AND circuits 4a and one of the NMOS transistors 4b make a pair. The circuit comprising a pair of one AND circuit 4a and one NMOS transistor 4b is provided in a one-to-one relationship to each of the bit lines BL.

One input of each of the AND circuits 4a is provided with the above-described write control signal WRC. N number of the other inputs of the AND circuits 4a are respectively provided with n bits of bit line selection signals D0 to Dn−1 output from the writing controller 1. An output of the AND circuits 4a is connected to the gate of respective counterparting NMOS transistors 4b.

A source of each of the NMOS transistors 4b is connected to a drain of the NMOS transistor 5a connected to the corresponding bit line BL. A drain voltage for writing VPD is applied to a drain of each of the NMOS transistors 4b.

Next, detailed description is given regarding the circuit structure of the differential sense amplifier SA0. It is noted that the differential sense amplifiers SA1 and SA2 have the same circuit structure as the differential sense amplifier SA0 and thus description of these two differential sense amplifiers SA1 and SA2 are omitted.

Figure 3:
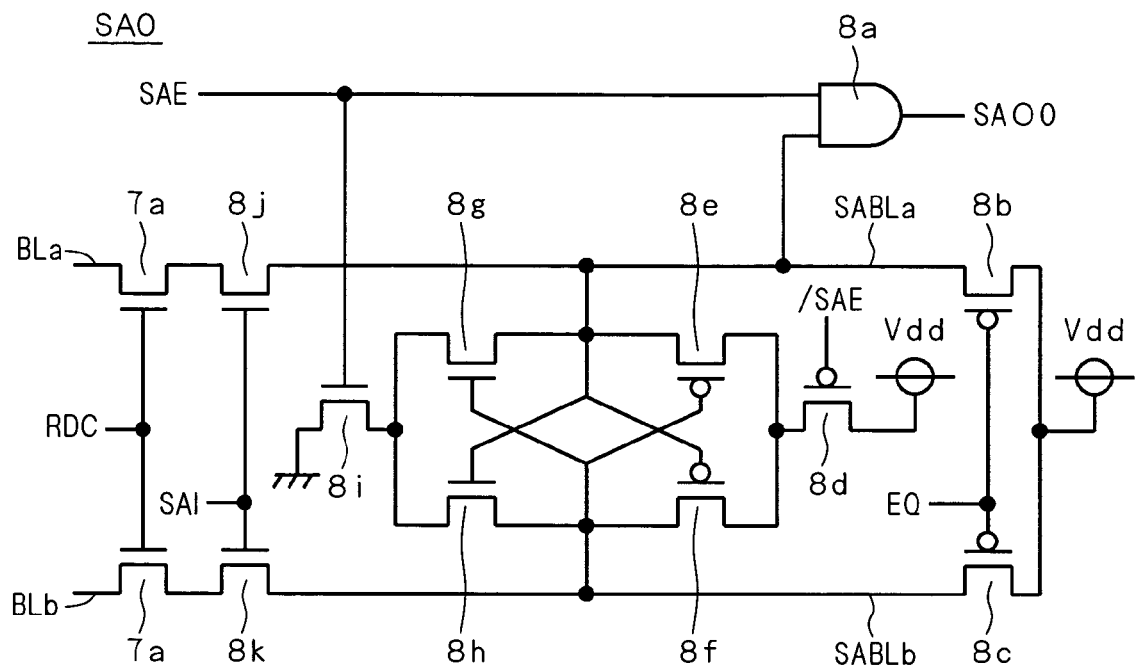
FIG. 3 is a circuit diagram illustrating the structure of a differential sense amplifier according to the preferred embodiment of the present invention.

FIG. 3 is a circuit diagram illustrating the structure of the differential sense amplifier SA0. In FIG. 3, for convenience in description, a bit line to which the true-side memory cell MC of the memory cell pair MCP is shown as "bit line BLa", and a bit line to which the bar-side memory cell MC of the memory cell pair MCP is shown as "bit line BLb".

As shown in FIG. 3, the supply voltage Vdd is applied to the differential sense amplifier SA0 as its supply voltage. The differential sense amplifier SA0 comprises an AND circuit 8a, PMOS transistors 8b to 8f and NMOS transistors 8g to 8k. One input of the AND circuit 8a is provided with a sense amplifier enable signal SAE output from the reading controller 2, and the other input of the AND circuit 8a is connected to a sense amplifier bit line SABLa. The AND circuit 8a performs logical operation to obtain a logical product of the sense amplifier enable signal SAE and the signal value of the sense amplifier bit line SABLa, and outputs the result as data SAO0.

A drain of the PMOS transistors 8b and 8c is connected to the sense amplifier bit line SABLa and SABLb, respectively. The supply voltage Vdd is applied to respective sources of the PMOS transistors 8b and 8c. Respective gates of the PMOS transistors 8b and 8c are supplied with a charge enable signal EQ output from the reading controller 2.

The supply voltage Vdd is applied to a source of the PMOS transistor 8d. A drain of the PMOS transistor 8d is connected to respective sources of the PMOS transistors 8e and 8f. An inverted sense amplifier enable signal /SAE output from the reading controller 2 is supplied to a gate of the PMOS transistor 8d. The inverted sense amplifier enable signal /SAE is an inversion signal of the sense amplifier enable signal SAE.

Drains of the PMOS transistor 8e and the NMOS transistor 8g are connected to each other, and also connected to the sense amplifier bit line SABLa. The drains of the PMOS transistor 8e and the NMOS transistor 8g are further connected to gate of the PMOS transistor 8f and gate of the NMOS transistor 8h. Drains of the PMOS transistor 8f and the NMOS transistor 8h are connected to each other, and also connected to the sense amplifier bit line SABLb. The drains of the PMOS transistor 8f and the NMOS transistor 8h are further connected to gate of the PMOS transistor 8e and gate of the NMOS transistor 8g. Drain of the NMOS transistor 8i is connected to respective sources of the NMOS transistors 8g and 8h. A ground potential is applied to a source of the NMOS transistor 8i.

Drains of the NMOS transistors 8j and 8k are connected to the sense amplifier bit lines SABLa and SABLb, respectively. A source of the NMOS transistor 8j is connected to a drain of the NMOS transistor 7a which is connected to the bit line BLa. A source of the NMOS transistor 8k is connected to a drain of the NMOS transistor 7a which is connected to the bit line BLb. Respective gates of the NMOS transistors 8j and 8k are provided with a sense amplifier input enable signal SAI output from the reading controller 2.

Next, description is given of operations of the differential sense amplifier SA0 according to the present preferred embodiment with such a configuration. In the following, description is given of the operations of the differential sense amplifier SA0 when the true-side memory cell MC has a higher threshold voltage than the bar-side memory cell MC, where the true-side memory cell MC and the bar-side memory cell MC are included in the memory cell pair MCP which is connected to the differential sense amplifier SA0.

It is noted that the differential sense amplifiers SA1 and SA2 operate in the same manner as the differential sense amplifier SA0 and thus description of these two differential sense amplifiers SA1 and SA2 are omitted.

Figure 4:
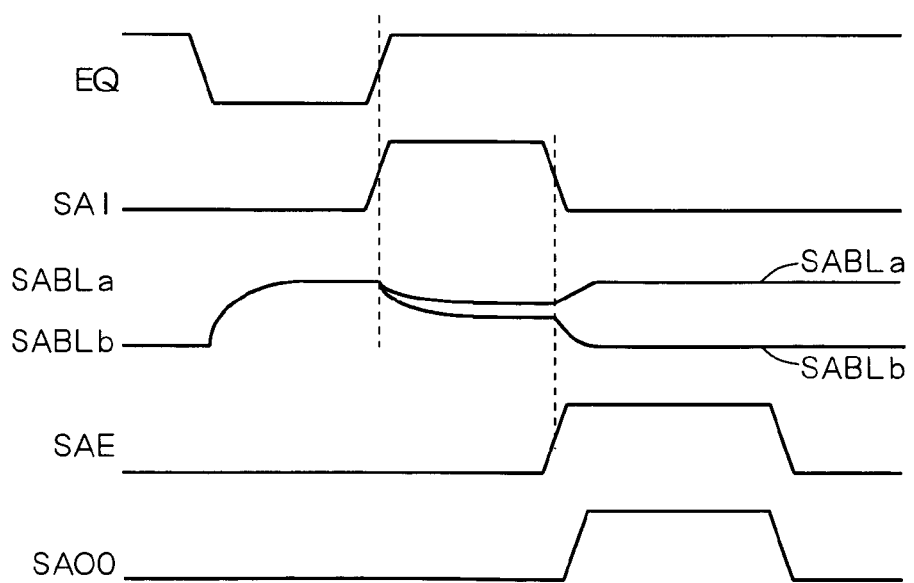
FIG. 4 shows signal waveforms generated in a differential sense amplifier according to the preferred embodiment of the present invention.

FIG. 4 shows respective signal waveforms generated in the differential sense amplifier SA0. When one of the word lines WL is activated thereby turning the NMOS transistors 7a on in the gate circuit for reading 7, the bit lines BLa and BLb and the source of the NMOS transistors 8j and 8k are electrically connected, respectively. FIG. 4 shows a state in which the sense amplifier input enable signal SAI is at a Low level with both the NMOS transistors 8j and 8k in an OFF state. In such a state, when the charge enable signal EQ enters a Low level, the PMOS transistors 8b and 8c enters an ON state, initiating the charging of the sense amplifier bit lines SABLa and SABLb and increasing the potentials thereof to the level of the supply voltage Vdd.

Then, when both the charge enable signal EQ and the sense amplifier enable signal SAI enter a High level, the PMOS transistors 8b and 8c turn off and the NMOS transistors 8j and 8k turn on. As a result, the bit lines BLa and BLb are electrically connected to the sense amplifier bit lines SABLa and SABLb, respectively, causing a current to flow through the true-side memory cell MC and the bar-side memory cell MC and reducing the potentials of the sense amplifier bit lines SABLa and SABLb.

It is noted that a smaller current flows through the memory cell MC with a higher threshold voltage. Since the true-side memory cell MC has a higher threshold voltage than the bar-side memory cell MC, the current flowing through the true-side memory cell MC is smaller than the current flowing through the bar-side memory cell MC. Accordingly, the sense amplifier bit line SABLa experiences a smaller voltage drop than the sense amplifier bit line SABLb does, and the sense amplifier bit line SABLa exhibits a larger potential than the sense amplifier bit line SABLb does. As a result, a minute potential difference is generated between the sense amplifier bit line SABLa and the sense amplifier bit line SABLb.

With such a minute potential difference existing between the sense amplifier bit line SABLa and the sense amplifier bit line SABLb, when the sense amplifier input enable signal SAI and the inverted sense amplifier enable signal/SAE enter a Low level and the sense amplifier enable signal SAE enters a High level, the potential difference is amplified by a differential amplification circuit comprising the PMOS transistors 8e and 8f and the NMOS transistors 8g and 8h. This brings the potential of the sense amplifier bit line SABLa up to the level close to the supply voltage Vdd and the potential of the sense amplifier bit line SABLb down to the level of a ground potential. As a result, a High level input is supplied to both inputs of the AND circuit 8a, and the AND circuit 8a generates "1" as its output data SAO0.

As described above, in the differential sense amplifier SA0, the difference in output between the true-side memory cell MC and the bar-side memory cell MC, i.e. the difference in drain current between the true-side memory cell MC and the bar-side memory cell MC, is converted to a potential difference which corresponds to the magnitude of the difference. Further, the potential difference is amplified. Then as an amplified result based on output difference between the true-side memory cell MC and the bar-side memory cell MC, data with a logical value ("1" in the above example) contrary to the logical value ("0" in the above example) written in the memory cell pair MCP is output from the differential sense amplifier SA0 as data SAO0.

Figures 5, 6:
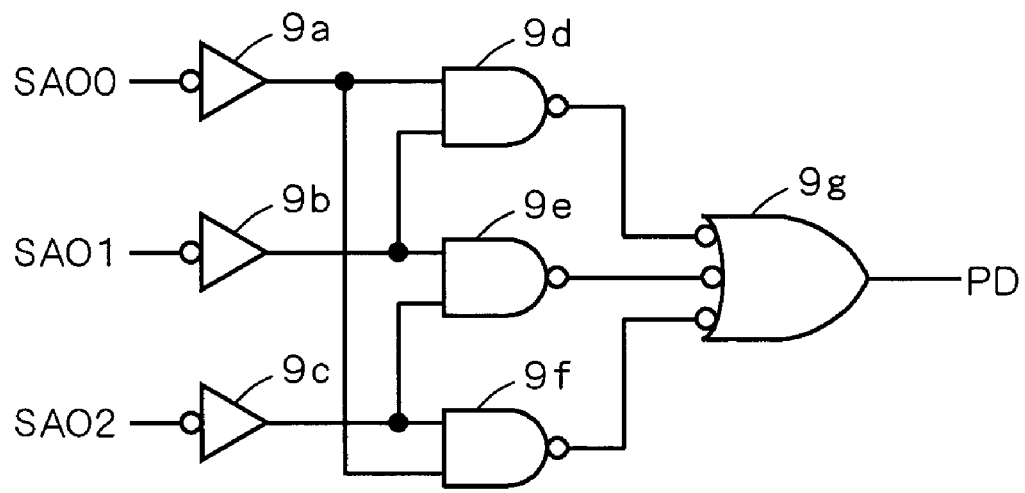
FIG. 5 is a circuit diagram illustrating the structure of a majority decision element according to the preferred embodiment of the present invention.
FIG. 6 is a truth table listing input value combinations and their corresponding output values regarding a majority decision element according to the preferred embodiment of the present invention.

Next, a detailed description is given of the majority decision element JD. FIG. 5 is a circuit diagram illustrating the structure of the majority decision element JD. As shown in FIG. 5, the majority decision element JD comprises NOT circuits 9a to 9c, NAND circuits 9d to 9f, and a three-input OR circuit 9g. The NOT circuits 9a, 9b and 9c invert the data SAO0, SAO1 and SAO2 output from the differential sense amplifiers SA0, SA1 and SA2 for outputting, respectively.

The NAND circuit 9d carries out a negative logical product operation of the outputs from the NOT circuits 9a and 9b for outputting. The NAND circuit 9e carries out a negative logical product operation of the outputs from the NOT circuits 9b and 9c for outputting. The NAND circuit 9f carries out a negative logical product operation of the outputs from the NOT circuits 9a and 9c for outputting. The OR circuit 9g finds a logical sum of inverted signals of the outputs from the NAND circuits 9a to 9c. Then, the obtained logical sum is output as data PD.

FIG. 6 is a truth table listing input value combinations and their corresponding output values regarding the majority decision element JD. As shown in FIG. 6, the majority decision element JD outputs an inverted signal of the value that occurs most often among the values carried by the data SAO0 to SAO2. That is, the majority decision element JD obtains a majority logic of the data SAO0 to SAO2, then outputs the inverted signal of the majority logic as the data PD.

In this manner, the majority decision element JD according to the present preferred embodiment obtains the majority logic of the data SAO0 to SAO2, thereby to decide data written to three memory cell pairs MCP which are electrically connected to one differential sense amplifier group SAG. For instance, when the majority logic of the data SAO0 to SAO2 exhibits "0", the majority decision element JD decides that the data written to the memory cell pairs MCP are "0" and outputs "1" as the decision result. Similarly, when the majority logic of the data SAO0 to SAO2 exhibits "1", the majority decision element JD decides that the data written to the memory cell pairs MCP are "1" and outputs "0" as the decision result.

Therefore, by obtaining the majority logic of the data SAO0 to SAO2 and deciding the data of three memory cell pairs MCP where the same data is to be written, even if a failure occurs in one of the three memory cell pairs MCP leading to abnormal data writing or abnormal data reading, it is possible to accurately decide whether the data written in the three memory cell pairs MCP is "1" or "0". This allows an accurate reading of the data written in the memory cell array 6, thereby improving the reliability of the present semiconductor memory device.

Respective differential sense amplifiers SA0 to SA2 output the inversion signal of the data written to their corresponding memory cell pair MCP. It follows that the data PD output by the majority decision element JD exhibits the majority logic of the data written to the three memory cell pairs MCP that are electrically connected to respective differential sense amplifiers SA0 to SA2. Therefore, by latching the data PD as they are in the latch circuit 10 and outputting the latched data as the data read from the memory cell array 6, information written to the present semiconductor memory device can be accurately conveyed to a CPU and the like.

The present preferred embodiment introduced a configuration wherein respective differential sense amplifiers SA0 to SA2 invert data from their corresponding memory cell pair MCP for outputting to the majority decision element JD, which in turn outputs an inversion signal of the majority logic of the received outputs from the amplifiers SA0 to SA2. However, another configuration may also be possible wherein respective differential sense amplifiers SA0 to SA2 output data of the corresponding memory cell pair MCP as they are, then the majority decision element JD outputs the majority logic of the outputs received from the amplifiers SA0 to SA2 as it is.

Figure 7:
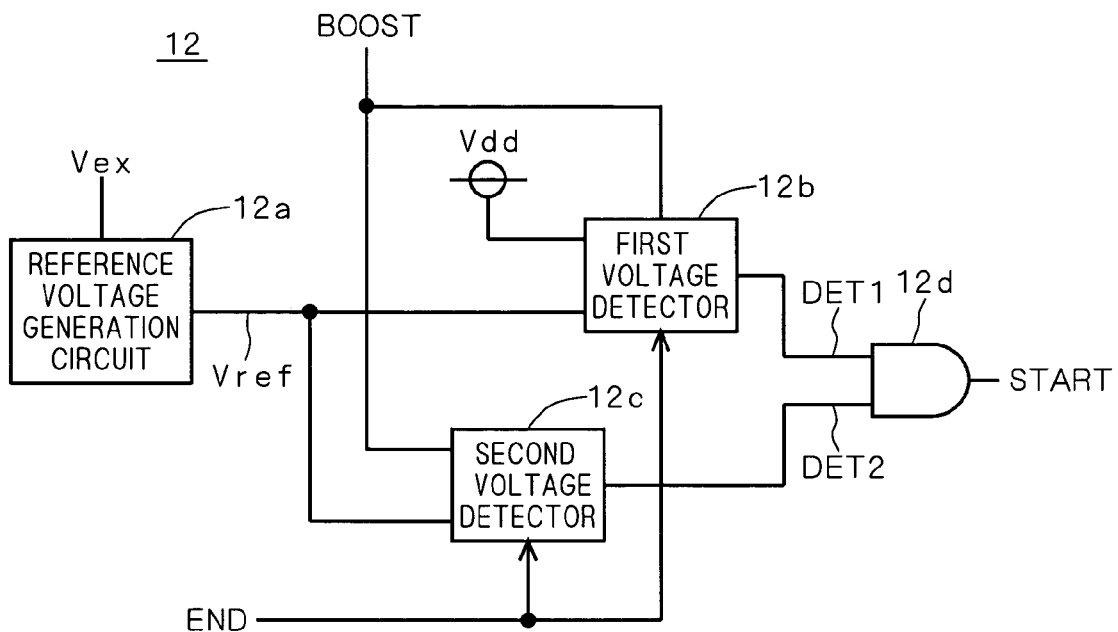
FIG. 7 is a block diagram illustrating the structure of a start-up detector according to the preferred embodiment of the present invention.

Next, a detailed description is given of the structure of the start-up detector 12. FIG. 7 is a block diagram illustrating the structure of the start-up detector 12. As shown in FIG. 7, the start-up detector 12 according to the present preferred embodiment comprises a reference voltage generation circuit 12a for generating and outputting a reference voltage for comparison Vref based on an external voltage Vex supplied from the outside of the present semiconductor memory device. The start-up detector 12 further comprises a first voltage detector 12b, a second voltage detector 12c and an AND circuit 1d.

The first voltage detector 12b compares the supply voltage Vdd and the first reference voltage Vref1 (not shown), and outputs the comparison result as a signal DET1. The second voltage detector 12c compares the internally boosted voltage BOOST and a second reference voltage Vref2 (not shown), and outputs the comparison result as a signal DET2. The AND circuit 12d carries out a logical product operation of the signals DET1 and DET2 for outputting the result to the reading controller 2 as a start signal START.

When an end signal END output from the reading controller 2 becomes "1", the first voltage detector 12b terminates the monitoring of the supply voltage Vdd, thereby terminating the comparison of the supply voltage Vdd and the first reference voltage Vref1. Similarly, when the end signal END becomes "1", the second reference voltage 12c terminates the monitoring of the internally boosted voltage BOOST, thereby terminating the comparison of the internally boosted voltage BOOST and the second reference voltage Vref2.

Figure 8:
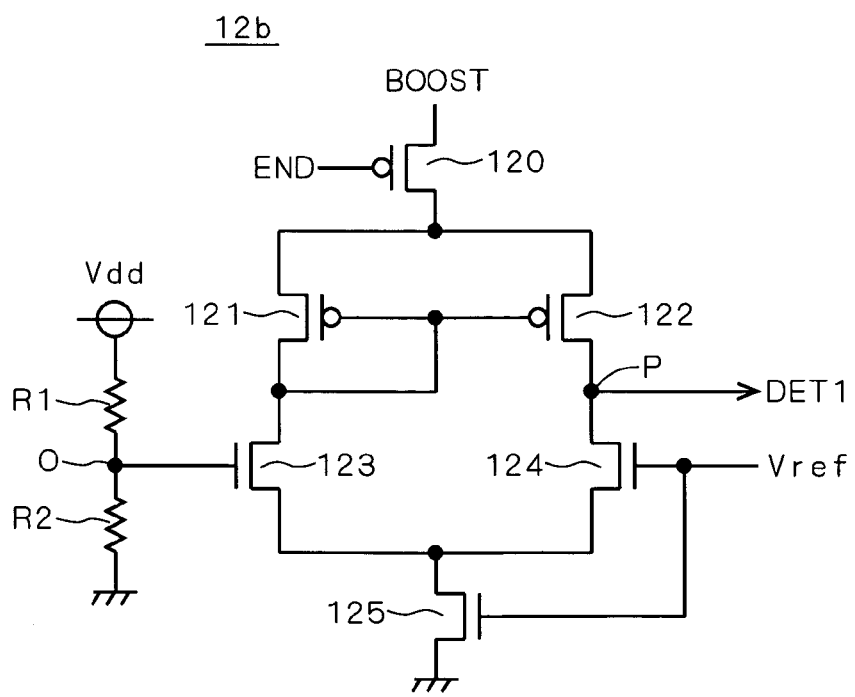
FIG. 8 is a circuit diagram illustrating the structure of a first voltage detector according to the preferred embodiment of the present invention.

FIG. 8 is a circuit diagram illustrating the structure of the first voltage detector 12b. As shown in FIG. 8, the first voltage detector 12b comprises resistors R1 and R2, PMOS transistors 120 to 122, and NMOS transistors 123 to 125. The PMOS transistors 120 to 122 and NMOS transistors 123 to 125 form a current-mirror differential amplifier. The internally boosted voltage BOOST is applied to a source of the PMOS transistor 120. A drain of the PMOS transistor 120 is connected to sources of the PMOS transistors 121 and 122. Further, a gate of the PMOS transistor 120 is supplied with the end signal END.

Gates of the PMOS transistors 121 and 122 are connected to each other, then further connected to a drain of the PMOS transistor 121. A drain of the NMOS transistor 123 is connected to a drain of the PMOS transistor 121. A drain of the NMOS transistor 124 is connected to a drain of the PMOS transistor 122. A drain of the NMOS transistor 125 is connected to sources of the NMOS transistors 123 and 124. A source of the NMOS transistor 125 is supplied with a ground potential.

One end of the resistor R1 is supplied with the supply voltage Vdd, and the other end of the resistor R1 is connected to one end of the resistor R2. The other end of the resistor R2 is supplied with a ground potential, and a junction point O between the resistors R1 and R2 is connected to a gate of the NMOS transistor 123. Gates of the NMOS transistors 124 and 125 are supplied with the reference voltage for comparison Vref. The potential of a junction point P between the drain of the PMOS transistor 122 and the drain of the NMOS transistor 124 is output as a signal DET1.

It is noted that the reference voltage generation circuit 12a has been supplied with the external voltage Vex without fail before the supply of the supply voltage Vdd and the internally boosted voltage BOOST begins. Therefore, the reference voltage for comparison Vref has reached a certain value when the supply voltage Vdd and the internally boosted voltage BOOST start to be supplied.

In the first voltage detector 12b with the above-described configuration, the potential at the junction point O between the resistors R1 and R2 is compared with the reference voltage Vref. When the potential at the junction point O is larger than the reference voltage Vref, the potential at the junction point P between the drain of the PMOS transistor 122 and the drain of the NMOS transistor 124 approximates the internally boosted voltage BOOST, thereby rendering the signal DET1 at a High level. On the other hand, when the potential at the junction point O is smaller than the reference voltage Vref, the potential at the junction point P approximates the ground potential, thereby rendering the signal DET1 at a Low level.

In the present preferred embodiment, for example, the supply voltage Vdd is set at 1.8 V, and the reference voltage Vref is set at 1.2 V. Further in the present preferred embodiment, for example, the resistors R1 and R2 are set at 15 kΩ and 85 kΩ, respectively. Therefore, in a state when the supply voltage Vdd is fully ready for operation and steady, the potential of the junction point O exhibits 1.53 V(=1.8×85 k/(15 K+85 K)).

Therefore, the first voltage detector 12b compares the value obtained by multiplying the supply voltage Vdd by 85/100 with 1.2 V. Then, it follows that the first voltage detector 12b compares the supply voltage Vdd with the value obtained by multiplying 1.2 V by 100/85, or about 1.4 V. This value of 1.4 V corresponds to the above-described first reference voltage Vref1.

As described above, the first voltage detector 12b according to the present preferred embodiment does not compare the supply voltage Vdd directly with the first reference voltage Vref1. Instead, the first voltage detector 12b compares a voltage value (potential at the junction point O) obtained by multiplying the supply voltage Vdd by a certain reduction rate with a voltage value (reference voltage Vref) obtained by multiplying the first reference voltage Vref1 by the same reduction rate, thereby to indirectly compare the supply voltage Vdd with the first reference voltage Vref1. As a result, when the supply voltage Vdd exceeds the first reference voltage Vref1, the signal DET1 enters a High level. In contrast, when the supply voltage Vdd drops lower than the first reference voltage Vref1, the signal DET1 enters a Low level. Further, when the end signal END enters a High level, the internally boosted voltage BOOST which serves as a supply voltage for the first voltage detector 12b no longer is supplied to the current-mirror differential amplifier. This terminates the monitoring of the supply voltage Vdd in the first voltage detector 12b.

Figure 9:
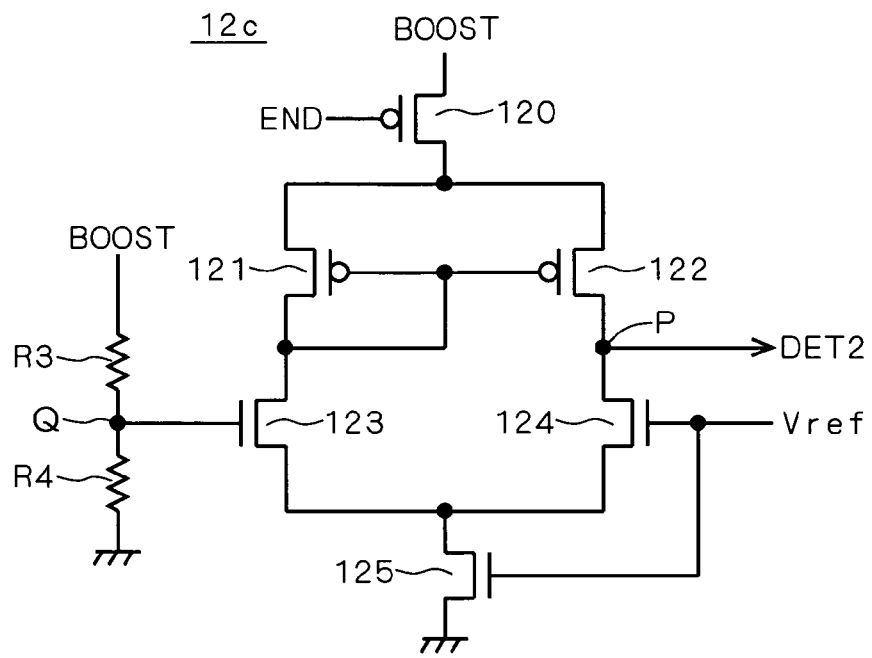
FIG. 9 is a circuit diagram illustrating the structure of a second voltage detector according to the preferred embodiment of the present invention.

FIG. 9 is a circuit diagram illustrating the structure of the second voltage detector 12c. Modifications made to the first voltage detector 12b are that in the second voltage detector 12c, resistors R3 and R4 are provided instead of the resistors R1 and R2, and one end of the resistor R3 is supplied with the internally boosted voltage BOOST.

One end of the resistor R3 is supplied with the internally boosted voltage BOOST, and the other end of the resistor R3 and one end of the resistor R4 are connected to each other. A ground potential is applied to the other end of the resistor R4, and a junction point Q between the resistors R3 and R4 is connected to the gate of the NMOS transistor 123. The potential of the junction point P between the drain of the PMOS transistor 122 and the drain of the NMOS transistor 124 is output as a signal DET2. The rest is the same structure as that of the first voltage detector 12b, and the description thereof is omitted.

In the second voltage detector 12c having the above configuration, the potential of the junction point Q is compared with the reference voltage Vref. Further, similar to the case of the first voltage detector 12b, when the potential of the junction point Q exceeds the reference voltage Vref, the signal DET2 enters a High level. In contrast, when the potential of the junction point Q drops lower than the reference voltage Vref, the signal DET2 enters a Low level.

In the present preferred embodiment, for example, the internally boosted voltage BOOST is set at 6 V, and the resistors R3 and R4 are set at 70 kΩ and 30 kΩ, respectively. Therefore, in a state when the supply voltage Vdd is fully ready for operation and the internally boosted voltage BOOST is steady, the potential of the junction point Q exhibits 1.8 V(=6.0×30 k/(30 k+70 k)).

Therefore, the second voltage detector 12c compares the value obtained by multiplying the internally boosted voltage BOOST by 30/100 with 1.2 V. Then, it follows that the second voltage detector 12c compares the internally boosted voltage BOOST with the value obtained by multiplying 1.2 V by 100/30, or 4 V. This value of 4 V corresponds to the above-described second reference voltage Vref2.

As stated above, similar to the case of the first voltage detector 12b, the second voltage detector 12c according to the present preferred embodiment does not compare the internally boosted voltage BOOST directly with the second reference voltage Vref2. Instead, the second voltage detector 12c compares a voltage value (potential at the junction point Q) obtained by multiplying the internally boosted voltage BOOST by a certain reduction rate with a voltage value (reference voltage Vref) obtained by multiplying the second reference voltage Vref2 by the same reduction rate, thereby to indirectly compare the internally boosted voltage BOOST with the second reference voltage Vref2. As a result, when the internally boosted voltage BOOST exceeds the second reference voltage Vref2, the signal DET2 enters a High level. In contrast, when the internally boosted voltage BOOST drops lower than the second reference voltage Vref2, the signal DET2 enters a Low level. Further, similar to the case of the first voltage detector 12b, when the end signal END enters a High level, the internally boosted voltage BOOST which serves as a supply voltage for the second voltage detector 12c no longer is supplied to the current-mirror differential amplifier. This terminates the monitoring of the internally boosted voltage BOOST in the second voltage detector 12c.

Figure 10:
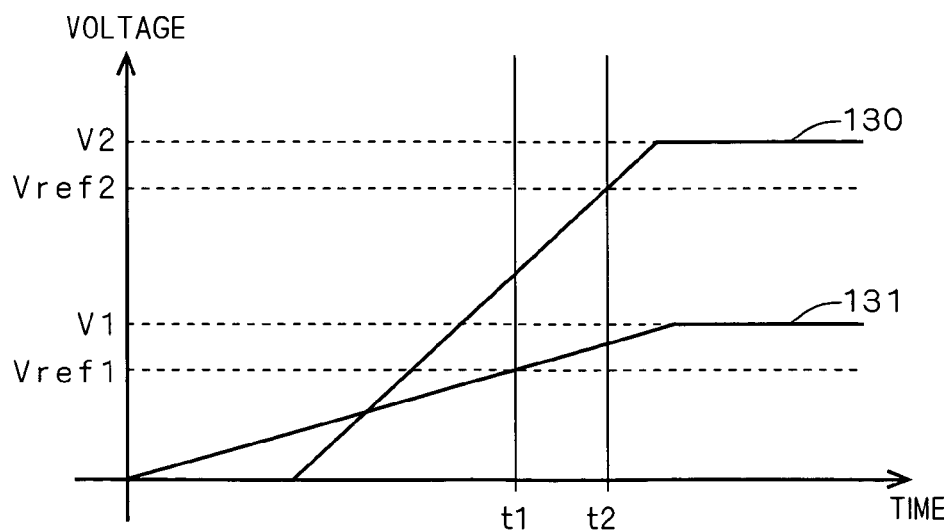

FIG. 10 shows the voltage waveforms of the supply voltage Vdd and the internally boosted voltage BOOST at power-on. Waveforms 130 and 131 in FIG. 10 represent the voltage waveforms of the internally boosted voltage BOOST and the supply voltage Vdd, respectively. Further in FIG. 10, "V1" represents the voltage value of the supply voltage Vdd in a steady state, and "V2" represents the voltage value of the internally boosted voltage BOOST in a steady state. Furthermore, "timing t1" represents a timing at which a detection is made that the supply voltage Vdd exceeds the first reference voltage Vref1, and "timing t2" represents a timing at which a detection is made that the internally boosted voltage BOOST exceeds the second reference voltage Vref2.

As can be seen from the voltage waveforms shown in FIG. 10, in the present preferred embodiment, the supply voltage Vdd and the internally boosted voltage BOOST are compared with a reference voltage independently provided for respective voltages Vdd and BOOST.

Based on the above description, when the supply voltage Vdd and the internally boosted voltage BOOST both exceed their respective reference voltages to be compared with, the start signal START serving as an output signal of the AND circuit 12d enters a High level. Further, when at least one of the supply voltage Vdd and the internally boosted voltage BOOST drops lower than their respective reference voltages to be compared with, the start signal START enters a Low level. When the start signal START changes from a Low level into a High level, the reading controller 2 starts reading data from the memory cell array 6. Further, when the start signal START changes from a High level into a Low level during reading, the reading controller 2 again performs data reading from the memory cell array 6. Next, data reading operation from the memory cell array 6 is described in detail.

When power is turned on and the start signal START changes from a Low level to a High level, i.e. a detection is made that the supply voltage Vdd and the internally boosted voltage BOOST both exceed their respective reference voltages in the start-up detector 12, the reading controller 2 starts the operations of the internally provided address counter 2a. This prompts the reading controller 2 to output the address signal ADR corresponding to either one of m number of word lines WL, and further to set the read control signal RDC to "1".

The address decoder 3 receives and decodes the address signal ADR, then outputs the word line activation signal for reading RAWL. At this time, since the write control signal WRC is set to "0" by the writing controller 1, the gate signal switching circuit 13 outputs the word line activation signal for reading RAWL, which in turn is supplied to the word line WL. This prompts the activation of either one of m number of word lines WL which corresponds to the value of the address signal ADR. Then the data of the memory cell pairs MCP connected to the activated word line WL are ready for reading.

The voltage value to be supplied to activate the word line WL, or the gate voltage for reading Vg1 to be supplied to the control gates of the true-side memory cells MC and the bar-side memory cells MC of the memory cell pairs MCP to be read, is 5 V, for example. This 5 V is generated from the internally boosted voltage BOOST. That is, the internally boosted voltage BOOST is a preceding voltage in relation to the gate voltage for reading Vg1.

The semiconductor memory device according to the present preferred embodiment comprises a voltage generation circuit (not shown) for generating 5 V from the internally boosted voltage BOOST for outputting. The voltage output from the voltage generation circuit is supplied as a supply voltage for the address decoder 3. Therefore, the voltage value of the part of the word line activation signal for reading RAWL for activating the word line WL output by the address decoder 3 is 5 V. Accordingly, 5 V is applied to the control gates of the true-side memory cells MC and the bar-side memory cells MC of the memory cell pairs MCP to be read.

As stated above, when one of the word lines WL is activated, the reading controller 2 controls the operations of the amplification circuit 8. This causes the output difference between the true-side memory cell MC and the bar-side memory cell MC included in respective memory cell pairs MCP connected to the activated word line WL to be amplified by one of the differential sense amplifiers SA0 to SA2. The amplified results are then output to the respective majority decision elements JD. Each of the majority decision elements JD obtains the majority logic based on the outputs from the differential sense amplifiers SA0 to SA2 and decides the data in the corresponding memory cell pairs MCP for outputting. The data PD output from each of the majority decision elements JD are latched in the latch circuit 10 for outputting to a CPU and the like as the read data RD0 to RDx−1.

Next, the reading controller 2 increases the count value of the address counter 2a by one, thereby outputting the address signal ADR with a value different from that of the previously output signal. The address signal ADR is decoded by the address decoder 3 and provided to the word line WL. As a result, the word line WL different from the previously activated word line WL is activated, and data are read from the memory cell pairs MCP connected to the newly activated word line WL. Finally, the read data RD0 to RDx−1 are output from the latch circuit 10.

By repeating the above-described procedure, the reading controller 2 reads data from all the memory cell pairs MCP of the memory cell array 6. When the address counter 2a reaches the count value corresponding to an address value assigned to the last word line WL to be activated, the reading controller 2 outputs the end signal END with the data "1" to the start-up detector 12. This terminates the reading from the memory cell array 6. Upon receiving the end signal END with the data "1", the start-up detector 12 stops monitoring the supply voltage Vdd and the internally boosted voltage BOOST.

When the start signal START changes from a High level to a Low level while data is read from the memory cell array 6, i.e. a detection is made that at least one of the supply voltage Vdd and the internally boosted voltage BOOST drops lower than their respective reference voltages to be compared with while reading data, the reading controller 2 resets the counter value of the address counter 2a and stops its operations. Afterwards, when the start signal START changes to a High level and a detection is made that the supply voltage Vdd and the internally boosted voltage BOOST both exceed their respective reference voltages, the reading controller 2 resumes the operations of the address counter 2a. This causes the memory cell array 6 to be read again.

In this manner, when one of the supply voltage Vdd and the internally boosted voltage BOOST drops lower than their respective reference voltages, the reading controller 2 reads the memory cell array 6 again. Therefore, even if one of the supply voltage Vdd and the internally boosted voltage BOOST drops temporally while the memory cell array 6 is read, leading to a failed data reading, the data reading from the memory cell array 6 can be performed securely.

Next, a detailed description is given of the writing operations regarding the memory cell array 6 of the semiconductor memory device according to the present preferred embodiment. Upon receiving the write command WRCOM from an externally provided CPU and the like, the writing controller 1 sets the write control signal WRC to "1" and puts the NMOS transistors 5a of the gate circuit for writing 5 in an ON state. At this time, the read control signal RDC is "0", therefore the transistors 7a of the gate circuit for reading 7a are in an OFF state.

The writing controller 1 outputs n bits of bit line selection signals D0 to Dn−1 and applies the drain voltage for writing VPD to the bit line BL connected to the memory cell MC whose threshold voltage is to be increased, thereby activating the bit line BL. It is noted that the drain voltage for writing VPD is generated from the internally boosted voltage BOOST by a voltage generation circuit (not shown) provided in the present semiconductor memory device. For example, the voltage value of the drain voltage for writing VPD is 4.5 V.

Next, the writing controller 1 outputs the word line activation signal for writing WAWL. Since the write control signal WRC is "1", the gate signal switching circuit 13 outputs the word line activation signal for writing WAWL to the word line WL. Therefore, the word line WL connected to the memory cell MC whose threshold voltage is to be increased is activated, and the gate voltage for writing Vg2 is applied to the control gate of the memory cell MC. As a result, hot electrons are injected into the floating gate of the memory cell MC which is connected to the activated bit line BL and activated word line WL, thereby increasing the threshold voltage of the memory cell MC.

The writing controller 1 repeats the above-described operations, carrying out hot electron injections into the memory cell MC to change its threshold voltage, thereby writing data to all the memory cell pairs MCP of the memory cell array 6.

The writing controller 1 according to the present preferred embodiment can set the threshold voltage of each memory cell MC to four levels, for example, 1.5 V, 3 V, 4.5 V and 6 V. In this example, the memory cell MC has the threshold voltage of 1.5 V when electrons are not injected into the floating gate of the memory cell MC. The writing controller 1 supplies a pulsed word line activation signals for writing WAWL a plurality of times to the word line WL connected to the memory cell MC whose threshold voltage is to be increased. Therefore, a pulsed gate voltage is given a plurality of times to the control gate of the memory cell MC whose threshold voltage is to be increased. The writing controller 1 decides the threshold voltage level of the memory cell MC based on the number of times the pulsed gate voltage is applied to the memory cell MC. That is, as the value of the threshold voltage to be set for the memory cell MC increases, the number of times the pulsed gate voltage is applied to the control gate of the memory cell MC increases.

As described above, since the writing controller 1 can set the threshold voltage of each memory cell MC to four levels, rewriting data of the memory cell pair MCP is easily carried out during a wafer test, for example. Detailed description of data rewriting is given in the following. In the following description, it is noted that setting the threshold voltage of the memory cell MC to 1.5 V, 3 V, 4.5 V and 6 V, is referred to as setting the memory cell MC to "11", "10", "01" and "00", respectively.

Figure 11:
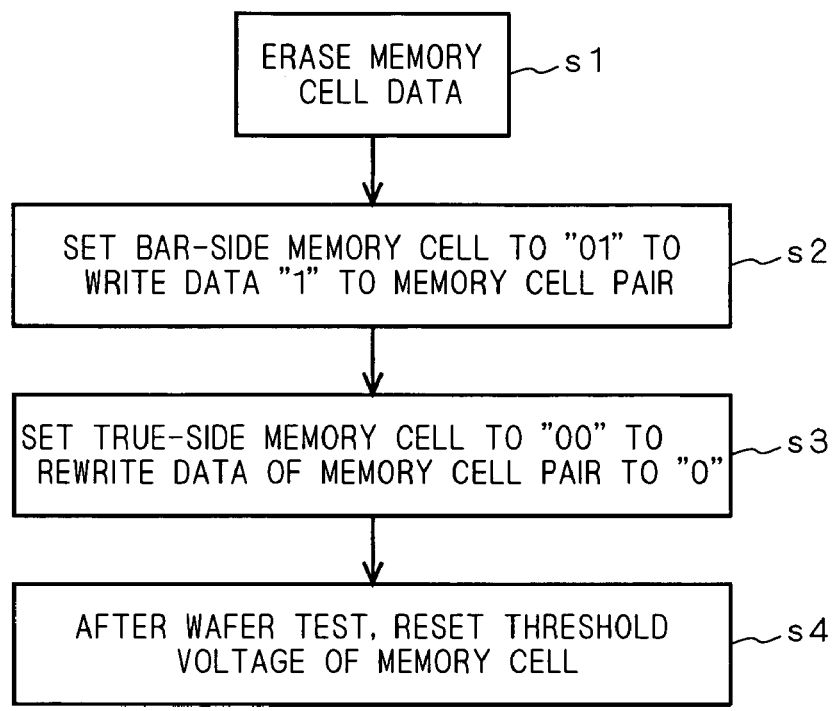
FIG. 11 is a flow chart illustrating operations of a nonvolatile semiconductor memory device according to the preferred embodiment of the present invention.

FIG. 11 is a flow chart illustrating operations of the semiconductor memory device of the present invention when the data of the memory cell pair MCP is rewritten during a wafer test. FIGS. 12A, 12B, 13A, 13B, 14A, 14B, 15A and 15B show the values (threshold voltage values) set for the memory cell MC in the steps of S1 to S4. FIG. 12A, 13A, 14A and 15A show the true-side memory cell MC, and FIGS. 12B, 13B, 14B and 15B show the bar-side memory cell MC.

Figure 12A:
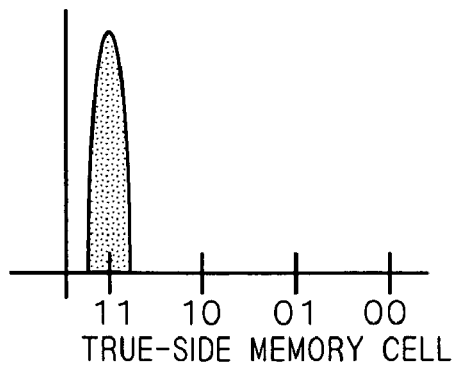
FIGS. 12A and 12B show values (threshold voltages) set for a memory cell according to the preferred embodiment of the present invention.
Figure 12B:
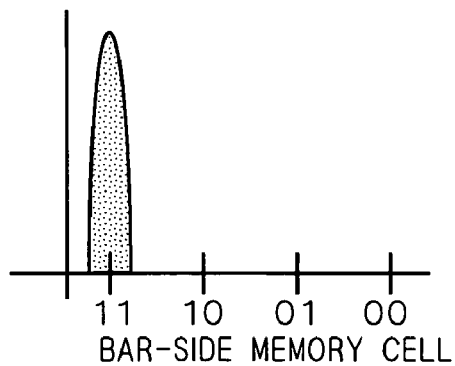
Figure 13A:
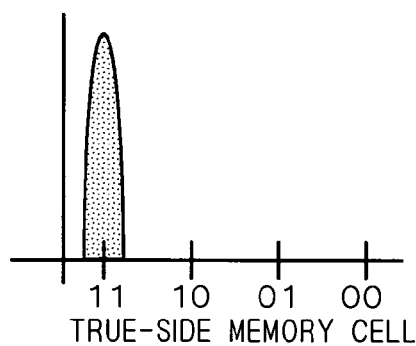
FIGS. 13A and 13B show values (threshold voltages) set for a memory cell according to the preferred embodiment of the present invention.
Figure 13B:
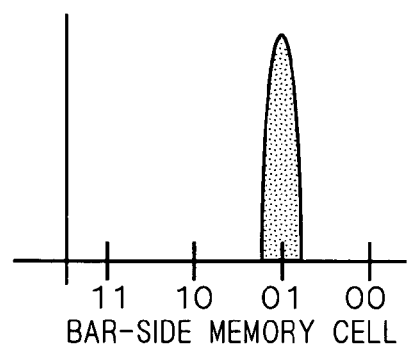

As shown in FIG. 11, in the step s1, the data written to the memory cell array 6 is erased using ultraviolet light. Then the values of the true-side memory cell MC and, the bar-side memory cell MC are both set to "11", as shown in FIGS. 12A and 12B. In the step s2, as shown in FIGS. 13A and 13B, electrons are injected only into the floating gate of the bar-side memory cell MC, thereby setting the bar-side memory cell MC to "01". This causes the true-side memory cell MC and the bar-side memory cell MC to exhibit the threshold voltage of 1.5 V and 4.5 V, respectively. As a result, the true-side memory cell MC has a smaller threshold voltage than that of the bar-side memory cell MC and data "1" is written to the memory cell pair MCP.

It is noted that in the step s2, the writing controller 1 sets the threshold voltage of the bar-side memory cell MC to one of the settable voltages, but excluding the one with the largest value.

Figure 14A:
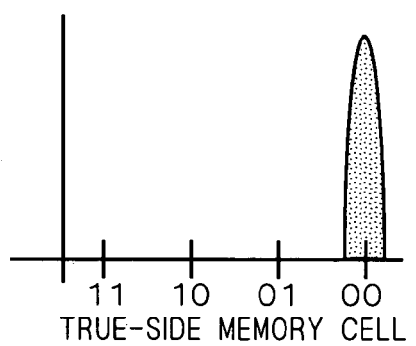
FIGS. 14A and 14B show values (threshold voltages) set for a memory cell according to the preferred embodiment of the present invention.
Figure 14B:
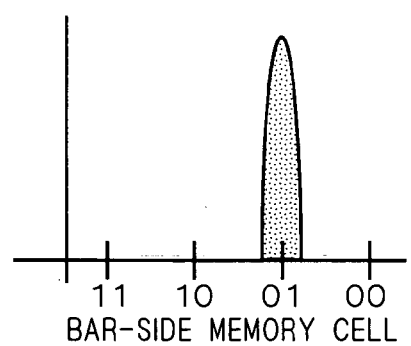
Figure 15A:
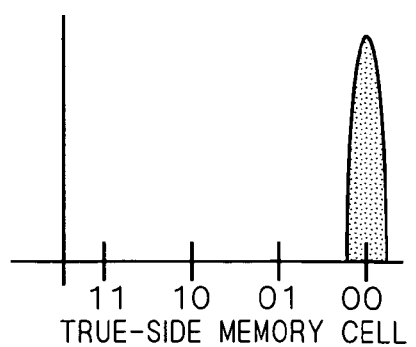
FIGS. 15A and 15B show values (threshold voltages) set for a memory cell according to the preferred embodiment of the present invention.
Figure 15B:
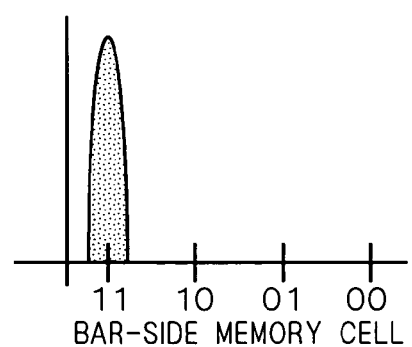

Next, in the step s3, electrons are injected only into the floating gate of the true-side memory cell MC, thereby setting the true-side memory cell MC to "00" (see FIGS. 14A and 14B). This causes the true-side memory cell MC and the bar-side memory cell MC to exhibit the threshold voltage of 6 V and 4.5 V, respectively. As a result, the true-side memory cell MC has a threshold voltage larger than that of the bar-side memory cell MC, and the data of the memory cell pair MCP is rewritten from "1" to "0". In the step s4, after the wafer test is over, the values (threshold voltage values) of the true-side memory cell MC and the bar-side memory cell MC are reset (see FIGS. 15A and 15B). This allows the difference between two input signals supplied to the differential sense amplifiers SA0 to SA2 to be secured to a satisfactory degree, thereby preventing the malfunction of the semiconductor memory device of the present invention after being sent to the market.

FIG. 16 is a flow chart illustrating operations of the semiconductor memory device of the present invention when the threshold voltage setting for each memory cell MC by the writing controller 1 is limited to two kinds only. The example shown in FIG. 16 is a case where the threshold voltage can be set to 1.5 V and 6 V. In this case, setting the threshold voltage of the memory cell MC to 1.5 V and 6 V, is referred to as setting the memory cell MC to "1" and "0", respectively.

As shown in FIG. 16, in step s11, the data written to the memory cell array 6 is erased using ultraviolet light. Then the values of the true-side memory cell MC and the bar-side memory cell MC are both set to "1". In step s12, electrons are injected only into the floating gate of the bar-side memory cell MC, thereby setting the bar-side memory cell MC to "0". This causes the true-side memory cell MC and the bar-side memory cell MC to exhibit the threshold voltage of 1.5 V and 6 V, respectively. As a result, the true-side memory cell MC has a smaller threshold voltage than that of the bar-side memory cell MC and data "1" is written to the memory cell pair MCP.

In this example, when the data of the memory cell pair MCP is rewritten from "1" to "0", i.e. when the threshold voltage of the true-side memory cell MC is changed to be larger than that of the bar-side memory cell MC, it is necessary to erase all the data from the memory cell array 6 by applying ultraviolet light in step s13. This step is necessary for the increased threshold voltage of the bar-side memory cell MC to be reset since the threshold voltage setting for the memory cell MC is limited to two kinds only.

After the data of the memory cell array 6 is erased in the step s13, the values of the true-side memory cell MC and the bar-side memory cell MC are all set to "1". In step s14, electrons are injected only into the floating gate of the true-side memory cell MC, thereby setting the true-side memory cell MC to "0". This causes the true-side memory cell MC and the bar-side memory cell MC to exhibit the threshold voltage of 6 V and 1.5 V, respectively. As a result, the true-side memory cell MC has a threshold voltage larger than that of the bar-side memory cell MC and the data of the memory cell pair MCP is rewritten from "1" to "0".

As described above, when the threshold voltage setting for the memory cell MC is limited to two kinds only, it is necessary to erase data once upon rewriting the data of the memory cell pair MCP. However, if the threshold voltage can be set to four levels, as in the present preferred embodiment, it is possible to rewrite data of the memory cell pair MCP without erasing the data. This enables the data rewriting to be performed easily.

The present preferred embodiment described a case when the threshold voltage can be set to four levels. However, the same advantageous effect can be achieved even if the threshold voltage setting for the memory cell MC is limited to three kinds only. In other words, if the threshold voltage can be set to three or more levels, data can be rewritten easily.

When the threshold voltage can be set to three levels of 1.5 V, 3 V and 4.5 V, for example, the threshold voltage of the true-side memory cell MC is set to a level lower than that of the threshold voltage of the bar-side memory cell MC, while setting the threshold voltage of the bar-side memory cell MC to a level except the largest voltage. That is, in the present example, the threshold voltages of the true-side memory cell MC and the bar-side memory cell MC are set to 1.5 V and 3 V, respectively, thereby writing the data "1" into the memory cell pair MCP. Upon rewriting the data of the memory cell pair MCP from "1" to "0", the threshold voltage of the true-side memory cell MC only is changed, thereby setting the threshold voltages of the true-side memory cell MC and the bar-side memory cell MC to 4.5 V and 3 V, respectively. This allows the data of the memory cell pair MCP to be rewritten without involving a data erasing operation.

As described above, in the semiconductor memory device according to the present preferred embodiment, the writing controller 1 can individually set the memory information for each of the memory cells MC of the memory cell array 6. Under this configuration, upon writing data to the memory cell array 6, it is possible to set a large difference in the memory information between two memory cells MC included in one memory cell pair MCP. This prevents a malfunction of a circuit for detecting a difference in such memory information, such as the differential sense amplifiers SA0 to SA2 according to the present preferred embodiment. As a result, the semiconductor memory device of the present invention will have an improved reliability.

Further, in the present preferred embodiment, the internally boosted voltage BOOST obtained by boosting the supply voltage Vdd is used as a supply voltage for the first voltage detector 12b. Accordingly, even if the supply voltage Vdd drops to a certain extent, a supply voltage capable of operating the first voltage detector 12b can be secured. This can suppress the malfunction of the first voltage detector 12b.

While the invention has been shown and described in detail, the foregoing description is in all aspects illustrative and not restrictive. It is therefore understood that numerous modifications and variations can be devised without departing from the scope of the invention.

What is claimed is:

1. A nonvolatile semiconductor memory device, comprising:

a memory cell array having a plurality of memory cells; and a writing controller for writing data to said memory cell array, wherein said memory cell array stores data in a nonvolatile state with respect to each memory cell pair composed of two memory cells, the data storing being executed based on a difference in memory information between said two memory cells, said writing controller is capable of individually setting said memory information for each of said memory cells of said memory cell array, each of said memory cells of said memory cell array is a memory cell transistor having a control gate and a floating gate, said writing controller sets said memory information of said memory cell by setting a threshold voltage of said memory cell of said memory cell array, and said nonvolatile semiconductor memory device further comprising a plurality of differential sense amplifiers, each of which for amplifying an output difference of said two memory cells included in the corresponding memory cell pair for outputting, wherein said writing controller executes writing data of the same value to plural pairs of said memory cell pairs, and said nonvolatile semiconductor memory device further comprises a decision element, wherein said decision element obtains a majority logic based on outputs from differential sense amplifiers among said plurality of differential sense amplifiers, each of said differential sense amplifiers being provided in a correspondence relationship to each of said plural pairs of said memory cell pairs, thereby to decide the data written to said plural pairs of said memory cell pairs for outputting.

2. The nonvolatile semiconductor memory device according to claim 1, wherein said writing controller is capable of setting the threshold voltage of said memory cells of said memory cell array to three or more levels.

3. A nonvolatile semiconductor memory device, comprising:

a memory cell array having a plurality of memory cells; and a writing controller for writing data to said memory cell array, wherein said memory cell array stores data in a nonvolatile state with respect to each memory cell pair composed of two memory cells, the data storing being executed based on a difference in memory information between said two memory cells, said writing controller is capable of individually setting said memory information for each of said memory cells of said memory cell array, each of said memory cells of said memory cell array is a memory cell transistor having a control gate and a floating gate, said writing controller sets said memory information of said memory cell by setting a threshold voltage of said memory cell of said memory cell array, and said nonvolatile semiconductor memory device further comprising a plurality of differential sense amplifiers, each of which for amplifying an output difference of said two memory cells included in the corresponding memory cell pair for outputting, the nonvolatile semiconductor memory device further comprising:

a reading controller for reading data from said memory cell array; and a detector for detecting levels of a first voltage and a second voltage in comparison with a reference voltage set for respective first and second voltages, wherein said first voltage is a voltage supplied to said plurality of differential sense amplifiers as a supply voltage, said second voltage is a voltage obtained by boosting said first voltage and is a preceding voltage of a gate voltage supplied to said control gate upon reading data from said memory cell array, said detector detects whether both said first voltage and second voltage increase above said respective reference voltages, and further detects whether at least one of said first voltage and second voltage drops below said respective reference voltages, and said reading controller newly executes data reading from said memory cell array when said detector detects that at least one of said first voltage and second voltage drops below said respective reference voltages while data is read from said memory cell array, and detects at a later time that both said first voltage and second voltage increase above said respective reference voltages.

4. The nonvolatile semiconductor memory device according to claim 3, wherein said detector comprises a voltage detector for detecting whether said first voltage level increases above said reference voltage and further detecting whether said first voltage level drops below said reference voltage, and said voltage detector is supplied with said second voltage as a supply voltage.

5. The nonvolatile semiconductor memory device according to claim 3, wherein said writing controller is capable of setting the threshold voltage of said memory cells of said memory cell array to three or more levels.

6. A method of rewriting data of a nonvolatile semiconductor memory device, said nonvolatile semiconductor memory device comprising a memory cell array having a plurality of memory cells, and a writing controller for writing data to said memory cell array, wherein said memory cell array stores data in a nonvolatile state with respect to each memory cell pair composed of two memory cells, the data storing being executed based on a difference in memory information between said two memory cells, each of the memory cells of said memory cell array is a memory cell transistor having a control gate and a floating gate, said writing controller is capable of setting a threshold voltage of each of said memory cells of said memory cell array to three or more levels, said writing controller sets said memory information of each of said memory cells individually by setting the threshold voltage of each of said memory cells of said memory cell array, and said nonvolatile semiconductor memory device further comprising a plurality of differential sense amplifiers for amplifying an output difference of two memory cells included in the corresponding memory cell pair for outputting, said method of rewriting data comprises the steps of:

(a) writing data to said memory cell pair; and (b) rewriting said data written in said step (a), wherein in step (a), the threshold voltage of one memory cell included in said memory cell pair is set to a lower level than that of the threshold voltage of the other memory cell in said memory cell pair, while said threshold voltage of said other memory cell is set to a level chosen from said three or more levels except the greatest one, and in step (b), the threshold voltage of said one memory cell is increased to a level greater than the threshold voltage of said other memory cell.

* * * * *